United States Patent
Lu et al.

(10) Patent No.: US 10,067,597 B2
(45) Date of Patent: Sep. 4, 2018

(54) ARRAY SUBSTRATE AND DISPLAY PANEL

(71) Applicants: SHANGHAI TIANMA MICRO-ELECTRONICS CO., LTD., Shanghai (CN); TIANMA MICRO-ELECTRONICS CO., LTD., Shenzhen (CN)

(72) Inventors: Feng Lu, Shanghai (CN); Liang Liu, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/194,308

(22) Filed: Jun. 27, 2016

(65) Prior Publication Data

US 2017/0220180 A1 Aug. 3, 2017

(30) Foreign Application Priority Data

Jan. 29, 2016 (CN) .......................... 2016 1 0068755

(51) Int. Cl.
*G06F 3/041* (2006.01)
*H01L 27/12* (2006.01)
*G06F 3/047* (2006.01)

(52) U.S. Cl.
CPC ............ *G06F 3/0416* (2013.01); *G06F 3/047* (2013.01); *G06F 3/0412* (2013.01);
(Continued)

(58) Field of Classification Search
CPC ........ G06F 3/041–3/0416; G06F 2203/04105; G06F 2203/04106; G06F 2203/04111;
(Continued)

(56) References Cited

U.S. PATENT DOCUMENTS

| 2006/0077186 A1* | 4/2006 | Park ...................... G06F 3/0412 |
| | | 345/173 |
| 2010/0123686 A1* | 5/2010 | Klinghult .............. G06F 3/0412 |
| | | 345/173 |

(Continued)

FOREIGN PATENT DOCUMENTS

| CN | 102216885 A | 10/2011 |
| CN | 102870220 A | 1/2013 |
| CN | 103712721 A | 4/2014 |

*Primary Examiner* — Nathan Danielsen
(74) *Attorney, Agent, or Firm* — Kilpatrick Townsend & Stockton LLP

(57) ABSTRACT

The present disclosure provides an array substrate and a display panel. The array substrate includes: a substrate; a plurality of scan lines formed on the substrate and extending along a first direction, a plurality of data lines formed on the substrate and extending along a second direction; a plurality of pixel units are defined by the scan lines and data lines, at least four semiconductor pressure sensing units formed on the substrate. In each of the plurality of the pixel units, a thin film transistor is provided. The substrate is further provided with a plurality of connection wires thereon, for connecting the semiconductor pressure sensing units to form at least one Wheatstone bridge structure. Using the array substrate provided in the present disclosure can the defect in the related art that the structure is complicated when the touch pressure sensor is integrated.

14 Claims, 13 Drawing Sheets

(52) U.S. Cl.
CPC .......... *G06F 3/0414* (2013.01); *H01L 27/124* (2013.01); *G06F 2203/04105* (2013.01); *G06F 2203/04111* (2013.01)

(58) Field of Classification Search
CPC ........... G06F 2203/04113; H01L 27/12; H01L 27/1214; H01L 27/124; H01L 27/1251; G09G 3/32–3/3291; G09G 3/36–3/3696
See application file for complete search history.

(56) References Cited

U.S. PATENT DOCUMENTS

| | | | |
|---|---|---|---|
| 2013/0076646 A1* | 3/2013 | Krah | G06F 3/0414 345/173 |
| 2013/0214279 A1* | 8/2013 | Nishimura | G06F 3/0412 257/59 |
| 2015/0084873 A1* | 3/2015 | Hagenbuch | G06F 3/0416 345/173 |
| 2015/0145812 A1* | 5/2015 | Sun | G06F 3/0412 345/174 |
| 2015/0169091 A1* | 6/2015 | Ho | G06F 3/0416 345/173 |
| 2016/0103545 A1* | 4/2016 | Filiz | G06F 3/0414 345/174 |

* cited by examiner

ARRAY SUBSTRATE AND DISPLAY PANEL

CROSS-REFERENCES TO RELATED APPLICATIONS

This application claims priority to a Chinese patent application No. 201610068755.4 filed on Jan. 29, 2016 and entitled "Array Substrate and Display Panel", the disclosure of which is incorporated herein by reference in its entirety.

TECHNICAL FIELD

The present disclosure relates to the field of touch display technologies, in particular to an array substrate and a display panel.

TECHNICAL BACKGROUND

Currently, as an information inputting tool, display panels having a touch function are widely used in various display products, such as mobile phone, tablet and information inquiring machine in public places and so on. Thus, a user merely needs to touch identifiers on the touch display panel with his finger in order to realize operations on the electronic devices, thereby eliminating the user's dependence on other input devices (i.e. keyboard and mouse) and making human-computer interaction easier. In order to better meet user's requirements, the touch display panel is usually provided with a pressure sensor for detecting magnitude of the touch pressure applied by the user. The pressure sensor is configured to not only capture information from touch position but also acquire the magnitude of the touch pressure so as to enlarge the application scope of the touch display technology.

In the related art, when being integrated, the touch pressure sensor can only be adhered to the back of the backlight module. In addition, in order to compensate temperature drift, it is necessary to arrange electrodes at both sides of the touch substrate and arrange perforations in the touch panel, and hence the structure is complicated.

SUMMARY OF THE INVENTION

The present disclosure provides an array substrate and a display panel to overcome defects in the related art that the structure is complicated when a touch pressure sensor is integrated.

In a first aspect, embodiments of the present disclosure provide an array substrate. The array substrate includes a substrate, a plurality of scan lines formed on the substrate, and a plurality of data lines formed on the substrate. The plurality of scan lines extends along a first direction. The plurality of data lines extends along a second direction. A plurality of pixel units are defined by the scan lines and data lines. In each of the plurality of the pixel units, a thin film transistor is provided. The thin film transistor comprises a gate electrode layer, an active layer and a source/drain electrode layer. At least four semiconductor pressure sensing units are formed on the substrate. The semiconductor pressure sensing units and the active layer are arranged in a same plane, and the semiconductor pressure sensing units are at least partially located in a display region of the array substrate. The substrate is further configured with a plurality of connection wires thereon, for connecting the semiconductor pressure sensing units to form at least one Wheatstone bridge structure.

In a second aspect, embodiments of the present disclosure provide a display panel, the display panel includes the above array substrate and an opposition substrate opposite to the array substrate.

According to various embodiments, the plurality of semiconductor pressure sensing units are arranged on the substrate and are arranged in the same layer with the active layer of the thin film transistor. The semiconductor pressure sensing units are at least partially located at the display region of the substrate and are connected through the plurality of connection wires formed on the substrate to form at least one Wheatstone bridge structure. In this way, the semiconductor pressure sensing units and the connection wires are integrated with the substrate, thereby solving the defect in the related art that the structure is complicated when the touch pressure sensor is integrated, and being adapted for mass production.

DETAILED DESCRIPTION OF THE PREFERRED EMBODIMENTS

The present disclosure will be described in detail below in conjunction with the accompanying drawings and the embodiments in the present disclosure. It should be understood that the specific embodiments described herein are only used to explain the present disclosure and are not used to limit the present disclosure. In addition, it is also noted that in order to facilitate description, only a part of structures relating to the present disclosure rather than the whole structures are illustrated in the accompanying drawings.

Figure 1A:
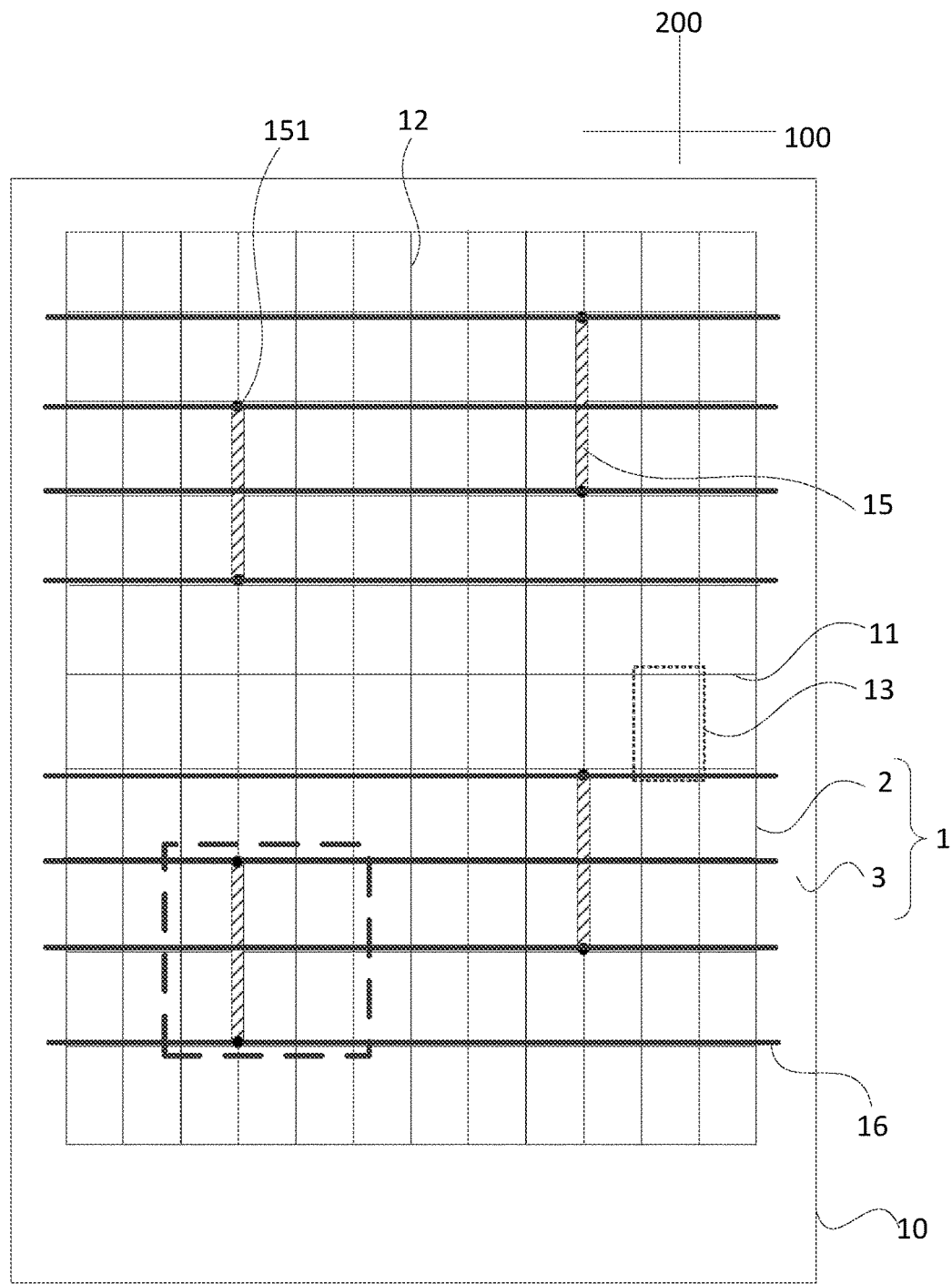
FIG. 1A is a schematic view showing a structure of an array substrate according to an embodiment of the present disclosure.
Figure 1B:
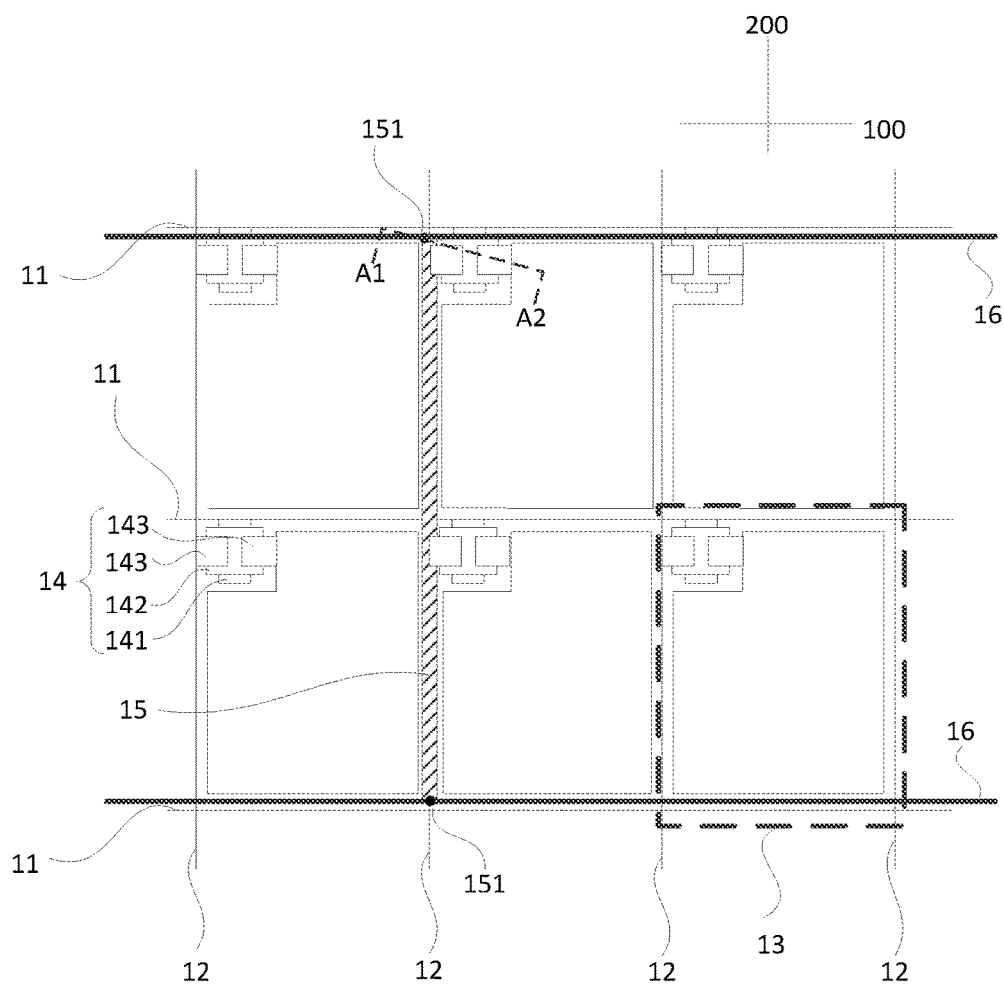
FIG. 1B is a partially enlarged diagram of the array substrate as shown in FIG. 1A.

FIG. 1A is a schematic view showing a structure of an array substrate according to an embodiment of the present disclosure. FIG. 1B is an enlarged diagram of a region enclosed by bold dotted lines in an array substrate in FIG. 1A. An array substrate 1 includes: a substrate 10; a plurality of scan lines 11 formed on the substrate 10 and extending along a first direction 100; and a plurality of data lines 12 formed on the substrate 10 and extending along a second direction 200. The data lines 12 and scan lines 11 are configured to define a plurality of pixel units 13. In each of the plurality of pixel units 13, a thin film transistor 14 is provided. The thin film transistor 14 includes a gate electrode layer 141, an active layer 142 and a source/drain electrode layer 143. As shown, at least four semiconductor pressure sensing units 15 are formed on the substrate 10 (the array substrate 1 shown in FIG. 1A illustratively includes four semiconductor pressure sensing units 15). The semiconductor pressure sensing units 15 and the active layer 142 are arranged in a same plane. As also shown, the semiconductor pressure sensing units are at least partially located at a display region 2 of the array substrate 1; a plurality of connection wires 16 are also formed on the substrate 10, for connecting the semiconductor pressure sensing units 15 to form at least one Wheatstone bridge structure. As compared with the array substrate in the related art, the array substrate in the above technical solution has a simple structure and is easily adapted for mass production.

Specifically, the semiconductor pressure sensing unit 15 has a strip-shaped structure extending along the second direction 200 (as shown in FIGS. 1A and 1B), and a length of the semiconductor pressure sensing unit 15 along the second direction 200 is larger than a length of one pixel unit 13 along the second direction 200. The array substrate 1 provided in various embodiments can be used to manufacture a liquid crystal display panel or an organic light-emitting diode display panel. When the array substrate 1 in the present disclosure is used to manufacture a liquid crystal display panel, under the consideration that a black matrix is generally disposed at a side of a color filter substrate opposite to the array substrate 1 in the existing liquid crystal display panel, a projection of the semiconductor pressure sensing unit 15 on the substrate 10 may optionally be located at a light shielding region of the black matrix between the pixel units 13, as shown in FIG. 1A. Alternatively, when a region of disclination lines is present in the pixel unit 13 of the array substrate 1, a projection of the semiconductor pressure sensing unit 15 on the substrate 10 may also be located at the region of disclination lines of the pixel unit 13. This arrangement can effectively reduce the affection of the semiconductor pressure sensing unit 15 on the display effect of the liquid crystal display panel.

Figure 2:
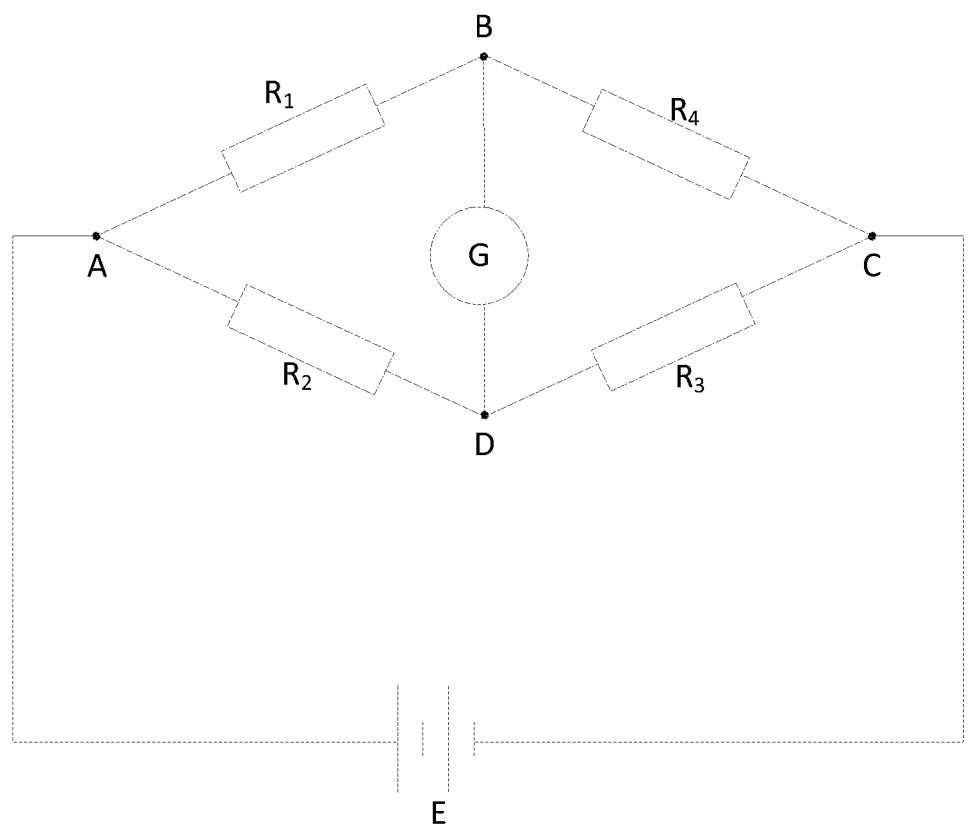
FIG. 2 is a principle diagram of a Wheatstone bridge in the related art.

FIG. 2 is a principle diagram of a Wheatstone bridge in the related art. Four resistors R1, R2, R3 and R4 are connected together to form a quadrangle ABCD, i.e. four arms of a bridge. A galvanometer G is arranged on the diagonal BD of the quadrangle ABCD, which is called as a "bridge"; the other diagonal AC of the quadrangle ABCD is connected to a power supply E. When the power supply E is turned on, currents flow through each of the branches of the bridge structure. When the four resistors R1, R2, R3 and R4 meet the relationship of $R_1/R_2=R_3/R_4$, electric potentials of points B and D are identical to each other: the value of the current flowing through the galvanometer G is zero, the pointer of the galvanometer G points to the graduation "0", the bridge is maintained at an equilibrium state, and the relationship of $R_1/R_2=R_3/R_4$ is called as the bridge equilibrium condition. When the values of the four resistors R1, R2, R3 and R4 do not meet the relationship of $R_1/R_2=R_3/R_4$ (i.e., do not meet the bridge equilibrium condition): the electric potentials of points B and D are different from each other, then the value of the current flowing through the galvanometer G in the bridge structure is not equal to zero, and the pointer of the galvanometer G deflects (i.e. the pointer of the galvanometer G does not point to the graduation "0"). The relationship of resistance values of the four resistors R1, R2, R3 and R4 can be obtained in computing operation by using the value outputted by the galvanometer G.

By using the above principle, the plurality of connection wires 16 are configured to connect the semiconductor pressure sensing units 15 together to form at least one Wheatstone bridge structure. Each of the semiconductor pressure sensing units 15 may be regarded as an arm of the Wheatstone bridge structure, and then four such arms are connected together by the connection wires 16 to form a Wheatstone bridge structure. Alternatively, it is also possible to connect two or more semiconductor pressure sensing units 15 in a series as an arm of the Wheatstone bridge structure, and four such arms are connected together by the connection wires 16 to form a Wheatstone bridge structure, which is not limited herein. In a specific design, each Wheatstone bridge optionally meets the bridge equilibrium condition at an initial state (i.e. a state in which no touch pressure is applied). Moreover, all the semiconductor pressure sensing units 15 may be connected on the array substrate 1 by the connection wires 16 in order to form one or more Wheatstone bridge structure.

Figure 3A:
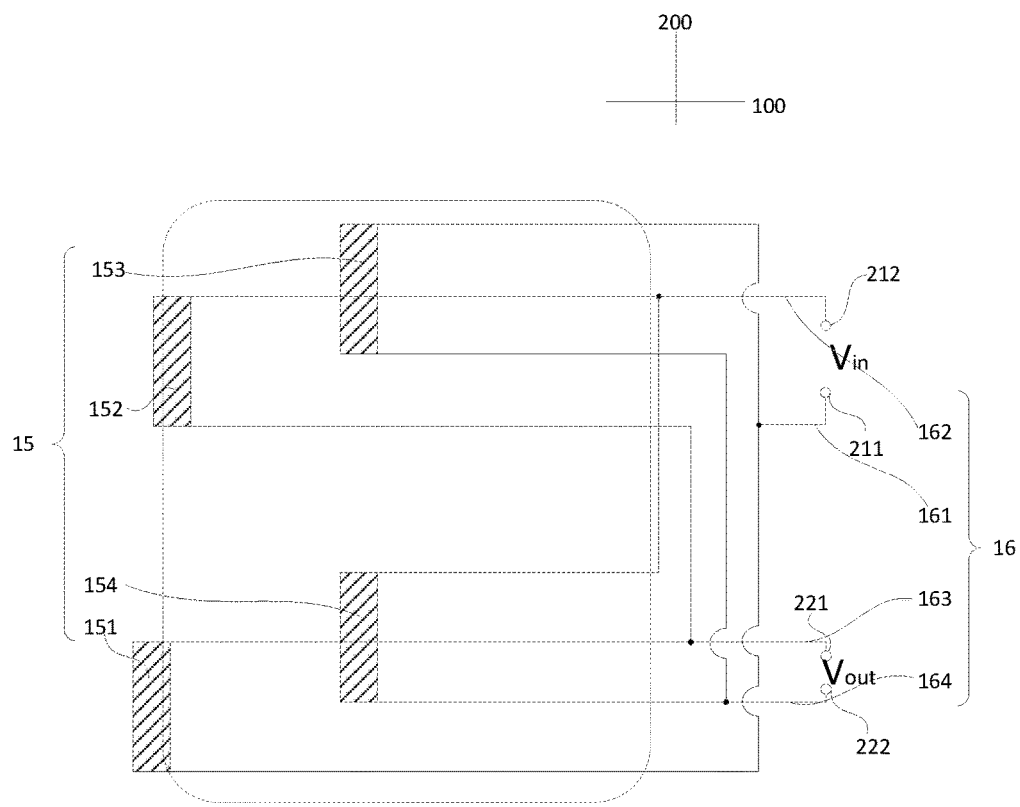
FIG. 3A is a schematic view showing a circuit connection in which four semiconductor pressure sensing units are connected together through the connection wires to form the Wheatstone bridge.
Figure 3B:
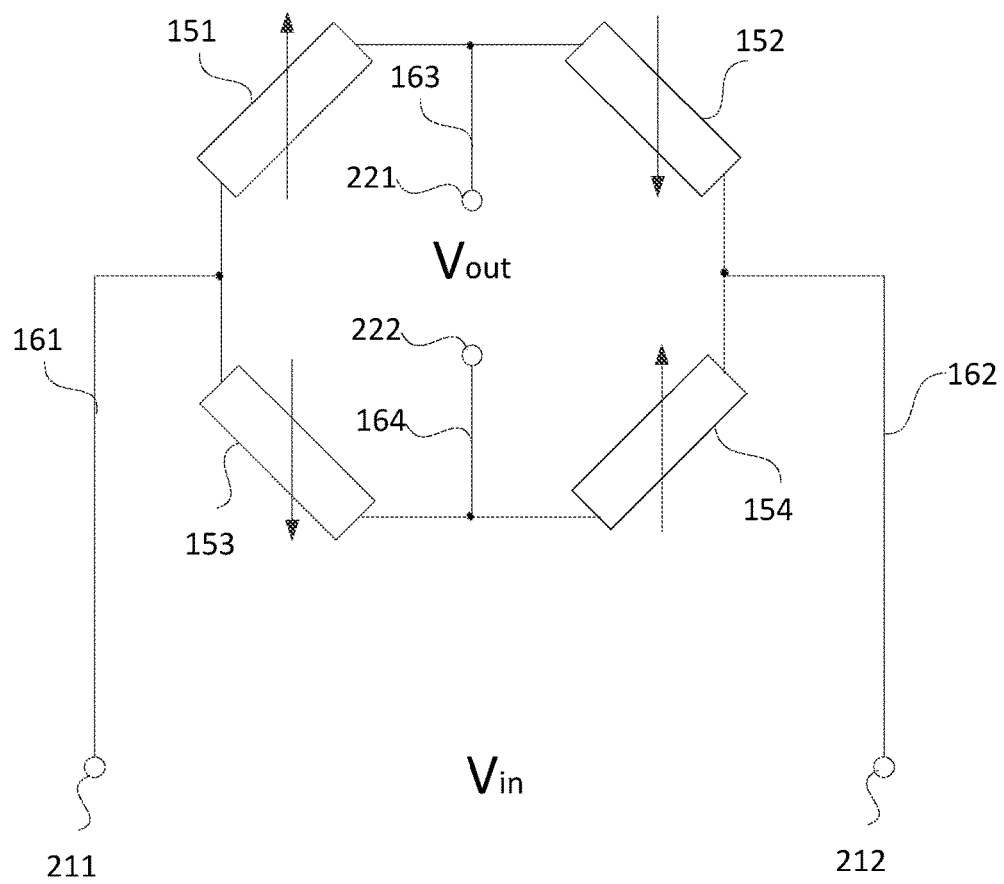
FIG. 3B is an equivalent circuit diagram of a circuit as shown in FIG. 3A.
Figure 3C:
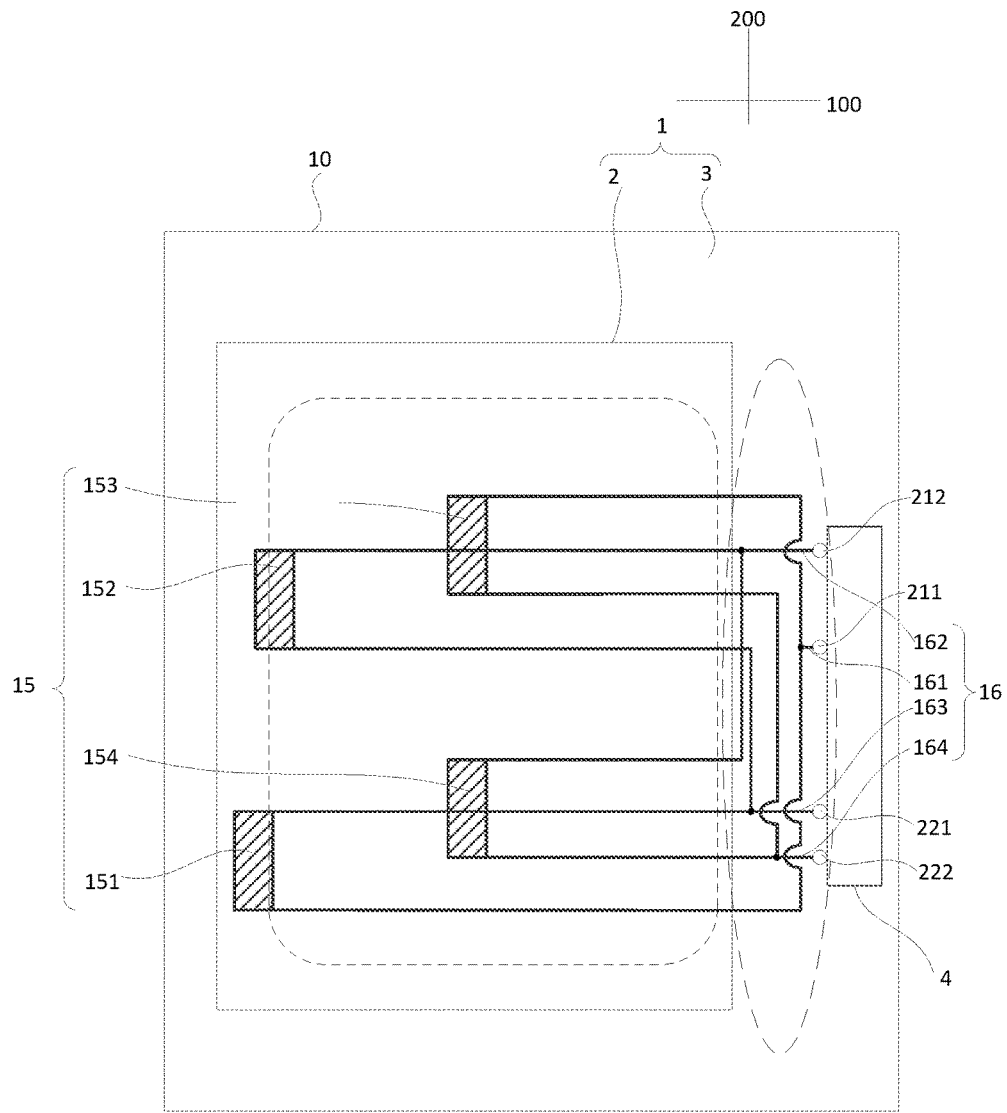
FIG. 3C is a schematic view showing the structure of the array substrate after the circuit shown in FIG. 3A is arranged on the array substrate.

FIG. 3A is a schematic view of a circuit connection in which four semiconductor pressure sensing units are connected together through the connection wires to form the Wheatstone bridge. FIG. 3B is an equivalent circuit diagram of a circuit shown in FIG. 3A. FIG. 3C is a schematic view showing the structure of the array substrate after the circuit shown in FIG. 3A is arranged on the array substrate. Each Wheatstone bridge structure includes a first semiconductor pressure sensing unit 151, a second semiconductor pressure sensing unit 152, a third semiconductor pressure sensing unit 153 and a fourth semiconductor pressure sensing unit 154. The plurality of connection wires 16 include a plurality of first connection wires 161, a plurality of second connection wires 162, a plurality of third connection wires 163 and a plurality of fourth connection wires 164.

A signal input terminal of the first semiconductor pressure sensing unit 151 and a signal input terminal of the third semiconductor pressure sensing unit 153 are electrically connected with the first connection wire 161 and are further electrically connected with a first detection input terminal 211 through the first connection wire 161. A signal input terminal of the second semiconductor pressure sensing unit 152 and a signal input terminal of the fourth semiconductor pressure sensing unit 154 are electrically connected with the second connection wire 162 and are further electrically connected with a second detection input terminal 212 through the second connection wire 162. A signal output terminal of the first semiconductor pressure sensing unit 151 and a signal output terminal of the second semiconductor pressure sensing unit 152 are electrically connected with the third connection wire 163 and are further electrically connected with a first detection output terminal 221 through the third connection wire 163. A signal output terminal of the third semiconductor pressure sensing unit 153 and a signal output terminal of the fourth semiconductor pressure sensing unit 154 are electrically connected with the fourth connection wire 164 and are further electrically connected with a second detection output terminal 222 through the fourth connection wire 164.

As shown in FIG. 3C, the working principle of the above array substrate 1 is as follows: after electrical signals are applied to the four semiconductor pressure sensing units 15 through the first detection input terminal 211 and second detection input terminal 212, when the display panel including the above array substrate 1 is not touched by a finger of a user, the Wheatstone bridge is maintained at an equilibrium state since it meets the bridge equilibrium condition, and hence the voltage value of the signal outputted between the first detection output terminal 221 and second detection output terminal 222 is zero. When the display panel including the above array substrate 1 is touched by the finger of the user, the whole array substrate 1 will be deformed, leading to a change in impedance value of strain resistance slices forming the respective semiconductor pressure sensing units 15 accordingly, so that the Wheatstone bridge no longer meets the bridge equilibrium condition. That is, the Wheatstone bridge is out of balance, and the voltage value of the signal outputted between the first detection output terminal 221 and second detection output terminal 222 is not zero. After reading the value of the output signal, the magnitude of the touch pressure generated when the user touches the display panel including the above array substrate 1 can be calculated based on the value of the output signal. The measurement for the magnitude of the touch pressure can be specifically used to the operations, such as a touch operation, a release operation or a drag operation and so on.

It should be noted that as shown in FIG. 3C, in some embodiments, the array substrate 1 is further configured with a driving chip 4 which is electrically connected with the first connection wire 161, the second connection wire 162, the third connection wire 163 and the fourth connection wire 164. The driving chip 4 is configured to apply electrical signals to individual semiconductor pressure sensing unit 15 through the first detection input terminal 211 and second detection input terminal 212, and then read the values of the signal outputted between the first detection output terminal 221 and second detection output terminal 222. In FIG. 3C, the driving chip 4 is disposed at a right side of a non-display region of the array substrate 1, which is only an example rather than intended to be limiting. In a specific design, the driving chip 4 may also be disposed at other positions of the non-display region of the array substrate 1.

In the above connection manner, the connection wire 16 mainly includes a lead portion and a bridging portion, the lead portion is electrically connected with the semiconductor pressure sensing unit 15, and the bridging portion is configured to form the Wheatstone bridge structure. Illustratively, as shown in FIGS. 3A and 3C, the lead portion are defined by portions of the four connection wires 16 (the first connection wire 161, the second connection wire 162, the third connection wire 163 and the fourth connection wire 164) which are located within a rectangle region with circular angles enclosed by dotted lines, and the lead portion extends along the first direction 100. The bridging portion is defined by portions of the four connection wires 16 which are located within an ellipse region enclosed by dotted lines. The bridging portion of the connection wire 16 is configured to connect the four semiconductor pressure sensing units 15 together to form a Wheatstone bridge structure. The lead portion and the bridging portion may be formed of the same material or different materials, and may be arranged in the same layer or in different layers. Further, the array substrate 1 also includes a non-display region 3 surrounding the display region 2, where the semiconductor pressure sensing unit 15 and the lead portion of the connection wire 16 may be disposed in the display region 2, and the bridging portion of the connection wire 16 may be disposed in the display region 2 or the non-display region 3.

In order to reduce the thickness of the array substrate for the purpose of thinning tendency of the display panel, the lead portion of the connection wire may be arranged in a same layer and extended along a same direction with the scan line, and the bridging portion of the connection wire and the scan line are arranged in a same layer or in different layers. When the bridging portion of the connection wire 16 and the scan line are arranged in the same layer, the bridging portion of the connection wire 16 is, in some embodiments, arranged at the non-display region 3 of the array substrate 1, as shown in FIG. 3C. This arrangement can effectively reduce the difficulty of manufacturing the array substrate 1, and can decrease the affection of the bridging portion of the connection wire 16 on the display effect of the display panel including the array substrate 1. When the bridging portion of the connection wire 16 and the scan line are arranged in different layers, for example, when the touch electrode and touch lead connecting the touch electrode are arranged on the array substrate, the bridging portion of the connection wire 16 may be arranged in the same layer with the touch lead. Then, the bridging portion of the connection wire 16 may be arranged in the display region 2 of the array substrate 1 or the non-display region 3 of the array substrate 1.

Figure 4:
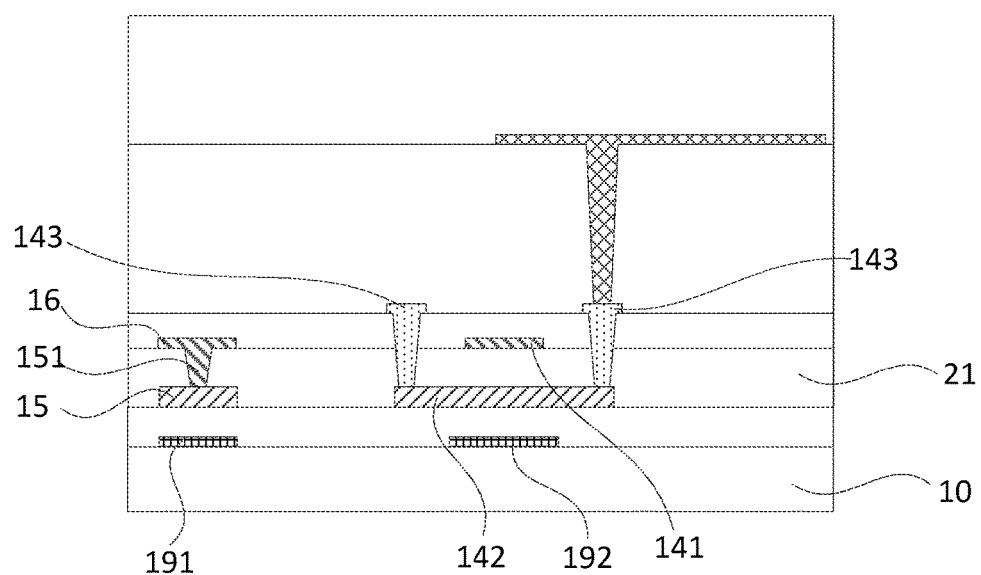
FIG. 4 is a sectional view of the array substrate in FIG. 1B along a line A1-A2.

Specifically, the method for arranging the bridging portion of the connection wire 16 and the scan line in the same layer and extending the bridging portion of the connection wire 16 and the scan line along the same direction is described as follows. As shown in FIG. 4, a first insulation layer 21 is disposed between a layer (that is a gate electrode layer 141 in FIG. 4) in which the scan lines are arranged and a layer in which the semiconductor pressure sensing unit 15 is arranged. As shown, the first insulation layer 21 is configured with a plurality of first through holes 151 through which the semiconductor pressure sensing units 15 are electrically connected with the corresponding lead portions.

Figure 5A:
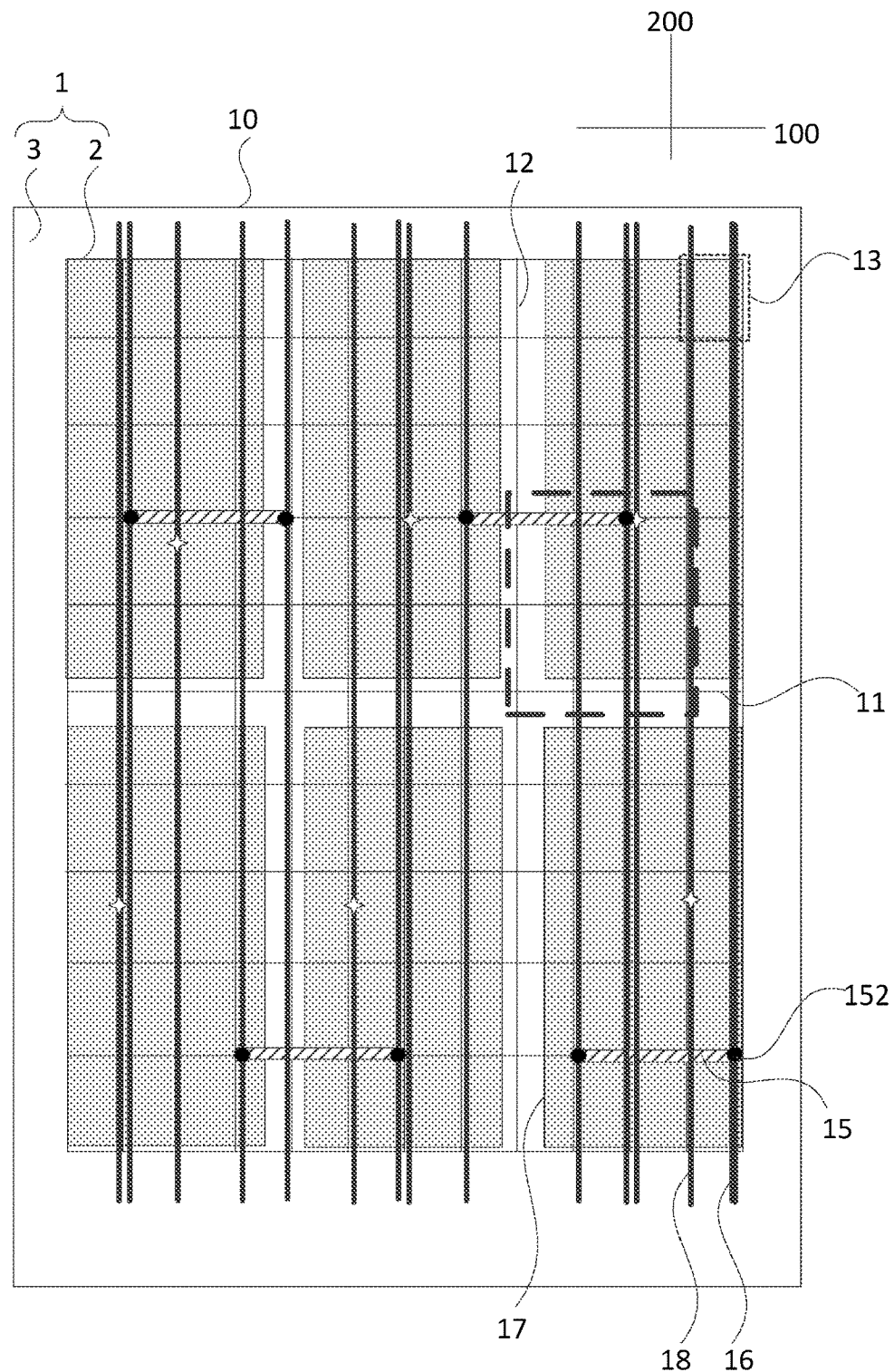
FIG. 5A is a schematic view showing the structure of another array substrate according to an embodiment of the present disclosure.
Figure 5B:
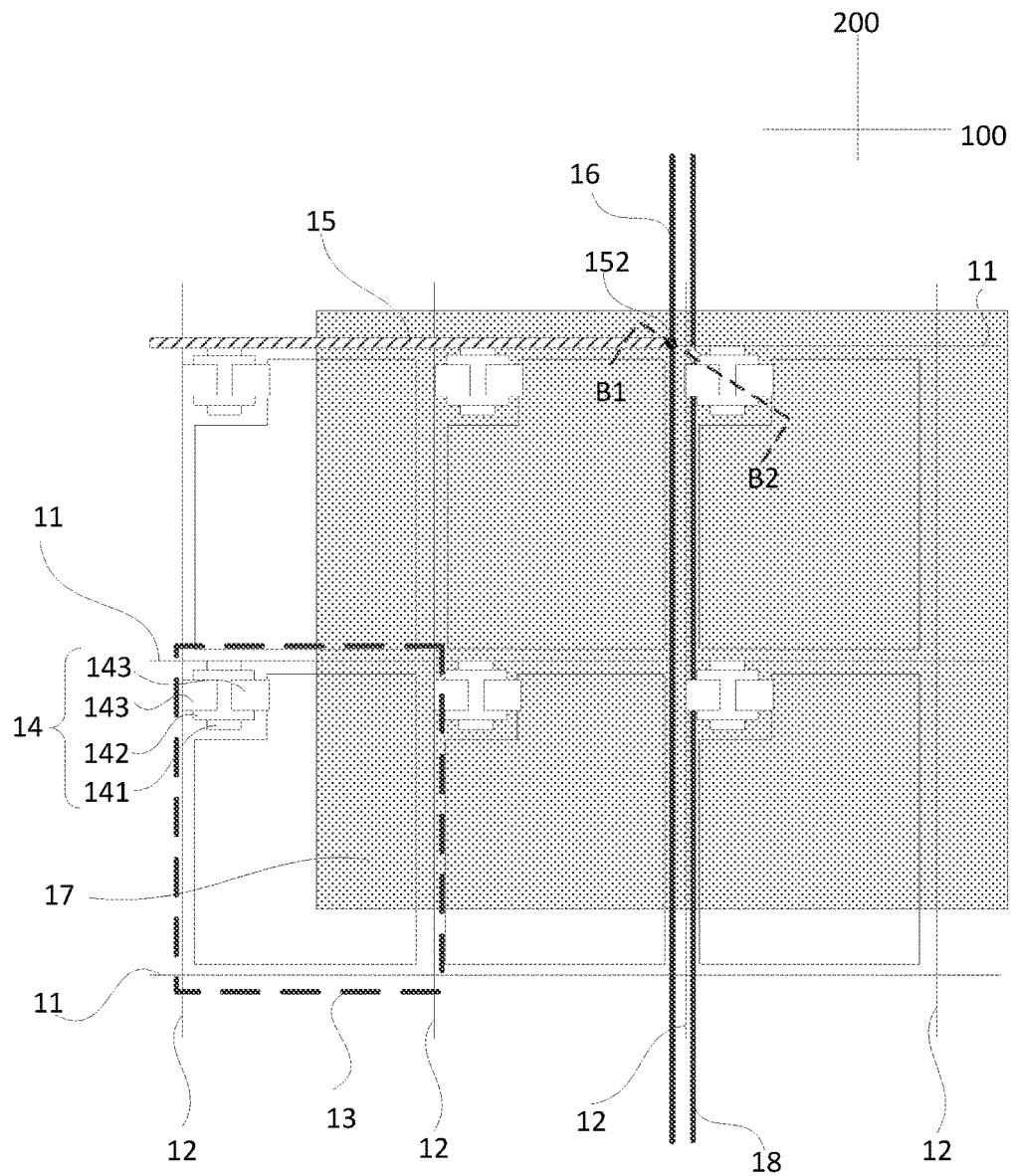
FIG. 5B is a partially enlarged diagram of the array substrate in FIG. 5A.

FIG. 5A is a schematic view showing the structure of another array substrate according to an embodiment of the present disclosure. FIG. 5B is a partially enlarged diagram of the array substrate shown in FIG. 5A. As compared with the array substrates shown in FIGS. 1A and 1B, the array substrates in FIGS. 5A and 5B further includes touch electrode and touch lead, and the lead portion of the connection wire and the touch lead are arranged in the same layer.

Specifically, the array substrate 1 includes: a substrate 10; a plurality of scan lines 11 formed on the substrate 10 and extending along a first direction 100 and a plurality of data lines 12 formed on the substrate 10 and extending along a second direction 200. As shown, the data lines 12 and scan lines 11 defines a plurality of pixel units 13. Each of the plurality of the pixel units 13 is provided with a thin film transistor 14 corresponding to the pixel unit 13. The thin film transistor 14 includes a gate electrode layer 141, an active layer 142 and a source/drain electrode layer 143. As also shown, at least four semiconductor pressure sensing units 15 formed on the substrate 10 (four semiconductor pressure sensing units 15 are illustratively shown in FIG. 5A). The semiconductor pressure sensing units 15 are arranged in the same layer with the active layer 142, and are at least partially located in a display region 2 of the array substrate 1. As also shown, the array substrate 1 further includes a plurality of connection wires 16 thereon, and the plurality of connection wires 16 are configured to connect the semiconductor pressure sensing units 15 to form at least one Wheatstone bridge structure. In addition, the array substrate 1 further includes a plurality of touch electrode blocks 17 formed on the substrate 10 (six touch electrode blocks 17 are illustratively shown in FIG. 5A), where the plurality of touch electrode blocks 17 are electrically connected with corresponding touch leads 18, respectively.

Figure 6:
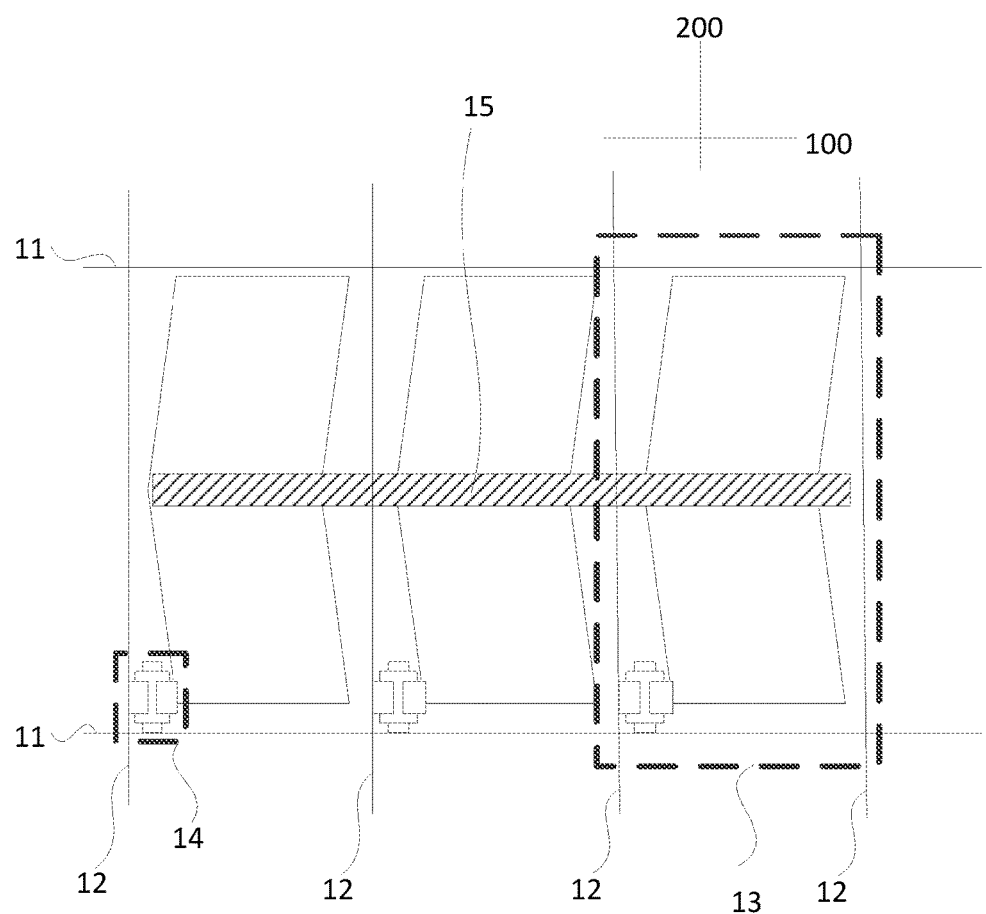
FIG. 6 is a schematic view showing a partial structure of still another array substrate according to an embodiment of the present disclosure.

Specifically, the semiconductor pressure sensing unit 15 has a strip-shaped structure extending along a first direction 100 (as shown in FIGS. 5A and 5B), and a length of the semiconductor pressure sensing unit 15 along the first direction 100 is larger than a length of one pixel unit 13 along the first direction 100. The array substrate 1 provided in various embodiments can be used to manufacture a liquid crystal display panel or an organic light-emitting diode display panel. When the array substrate 1 in the present disclosure is used to manufacture the liquid crystal display panel, under the consideration that a black matrix for preventing light leakage at each of the pixel units is generally disposed at a side of a color filter substrate in the existing liquid crystal display panel, projection of the semiconductor pressure sensing unit 15 on the substrate 10 may optionally be located at a light shielding region of the black matrix between the pixel units 13, as shown in FIGS. 5A and 5B. This arrangement can effectively reduce the affection of the semiconductor pressure sensing unit on the display effect of the liquid crystal display panel. In addition, as shown in FIG. 6, the projection of the semiconductor pressure sensing unit 15 on the substrate 10 may also be arranged in a region of domain lines of the pixel unit 13. Since the alignment of the liquid crystal molecules are out of orders in the region of domain lines of liquid crystal display panel, and the luminance of the region of domain lines is darker than that of other regions, Such arrangement that the semiconductor pressure sensing unit 15 is located in the region of domain lines can likewise reduce the affection of the semiconductor pressure sensing unit 15 on the display effect of the liquid crystal display panel.

Figure 7:
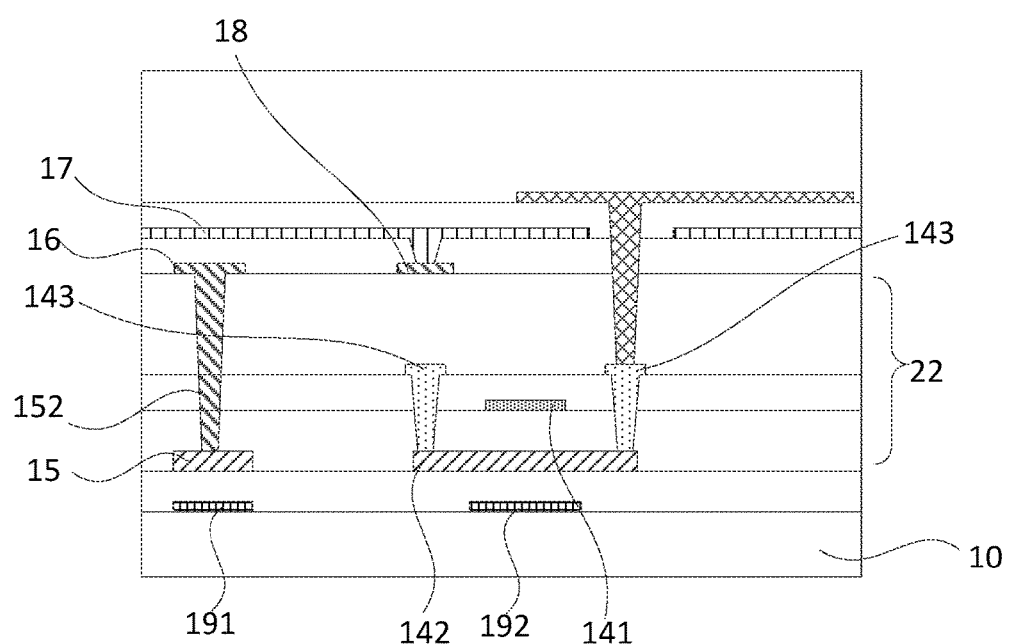
FIG. 7 is a sectional view of the array substrate in FIG. 5B along a line B1-B2.

In order to reduce the thickness of the array substrate for the purpose of thinning tendency of the display panel, the touch lead can be configured to extend along a second direction, the lead portion of the connection wire and the touch lead are arranged in the same layer and extend along the same direction, and the bridging portion of the connection wire and the touch lead are arranged in the same layer or are arranged at different layers. If the touch lead is arranged to extend along a second direction 200, the lead portion of the connection 16 and the touch lead 18 are located in the same layer and extend along the same direction, and the specific arrangement of the structure is as shown in FIG. 7. A second insulation layer 22 is disposed between a layer where the touch lead 18 is arranged and a layer where the semiconductor pressure sensing unit 15 is arranged, where the second insulation layer 22 includes a plurality of second through holes 152 through which the semiconductor pressure sensing unit 15 is electrically connected with the lead portion of the connection wire 16 corresponding to the semiconductor pressure sensing unit 15.

Figure 8:
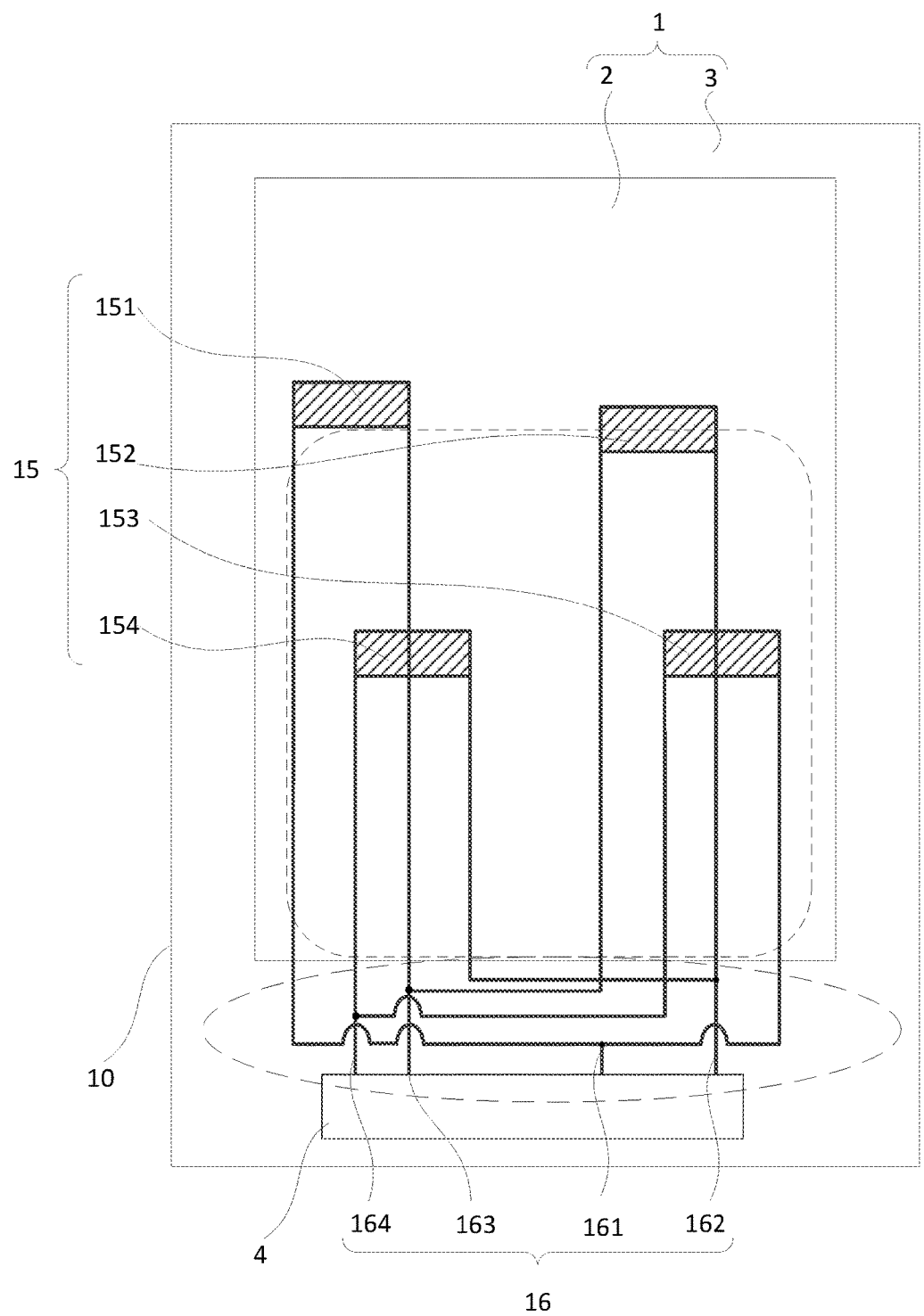
FIG. 8 is a schematic view showing the structure of an array substrate after the circuit structure in which the four semiconductor pressure sensing units in FIG. 5A are connected together through the connection wires to form the Wheatstone bridge is arranged on the array substrate.

Similarly, the array substrate further includes a non-display region surrounding the display region. The semiconductor pressure sensing unit and the lead portion of the connection wire are arranged in the display region, and the bridging portion of the connection wire is arranged in display region or the non-display region. Illustratively, as shown in FIG. 8, the lead portion of the four connection wires 16 (the first connection wire 161, the second connection wire 162, the third connection wire 163 and the fourth connection wire 164) that is located within a rectangle region with circular angles enclosed by dotted lines is arranged in the display region 2 of the array substrate 1. The bridging portion of the four connection wires 16 that is located within an ellipse region enclosed by dotted lines is arranged in the non-display region 3 of the array substrate 1. When the bridging portion of the connection wire 16 and the touch leads 18 are arranged in the same layer, the bridging portion of the connection wire 16 is optionally arranged in the non-display region 3 of the array substrate 1. This arrangement can effectively reduce the difficulty of manufacturing the array substrate 1, and can decrease the affection of the bridging portion of the connection wire 16 on the display effect of the display panel including the array substrate 1. When the bridging portion of the connection wire 16 and the touch lead are arranged in different layers, for example, the bridging portion of the connection wire 16 is arranged in the same layer with the scan lines, the bridging portion of the connection wire 16 may be arranged in the display region 2 of the array substrate 1 or in the non-display region 3 of the array substrate 1.

In this embodiment as shown, the method of connecting the semiconductor pressure sensing units together through the connection wires to form at least one Wheatstone bridge structure is the same as the above method, which is not discussed again in detail herein. Further, as shown in FIG. 8, the array substrate further includes a driving chip 4 which is electrically connected with the first connection wire 161, the second connection wire 162, the third connection wire 163 and the fourth connection wire 164, in order to apply electrical signals to respective semiconductor pressure sensing units 15 through two detection input terminals of the Wheatstone bridge, and to read the values of the electrical signals outputted by the two detection output terminals. The magnitude of the touch pressure can be calculated according to the values of the electrical signals and touch detection signals outputted by the touch electrode blocks 17. In FIG. 8, the driving chip 4 is arranged below the non-display region of the array substrate 1, which is merely an example rather than intended to be limiting. In a specific design, the driving chip 4 may also be arranged in other regions of the non-display region of the array substrate 1.

According to embodiments of the present disclosure, the touch electrodes block are arranged on the array substrate, and the driving chip can determine the touch position according to the touch detection signals outputted by the touch electrode blocks. On this basis, the magnitude of the touch pressure can be determined by the values of electrical signals outputted by the two detection output terminals of the Wheatstone bridge, thereby further improving the recognition capability of magnitude of the touch pressure on the array substrate.

Further, it is considered that for the liquid crystal display panel, after lights emitted by the back-light source of the back-light module are emitted onto the semiconductor pressure sensing unit or the active layer of the thin film transistor, current would be generated in the semiconductor pressure sensing unit or in the active layer of the thin film transistor. If the current is formed in the semiconductor pressure sensing unit, the sensitivity of the semiconductor pressure sensing unit would be affected due to the current. If the current is formed in the active layer of the thin film transistor, the performance of turning on and off of the thin film transistor would be affected due to the current, thus affecting the display effect. As a result, in some embodiments, as shown in FIGS. 4 and 7, a first light shielding layer 191 is provided between the semiconductor pressure sensing unit 15 and the substrate 10, and a second light shielding layer 192 is provided between the active layer 142 and the substrate 10, and the first light shielding layer 191 and the second light shielding layer 192 are arranged in the same layer.

Figure 9:
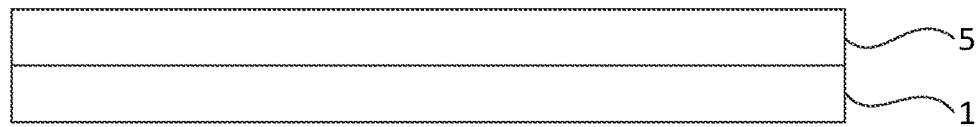
FIG. 9 is a schematic view showing the structure of a display panel according to an embodiment of the present disclosure.

A display panel is also provided according to the embodiments of the present disclosure. FIG. 9 is a schematic view showing the structure of a display panel according to an embodiment of the present disclosure. The display panel includes the above array substrate 1 according to any of the technical solutions of the present disclosure and an opposition substrate 5 opposite to the array substrate 1.

According to the embodiments of the present disclosure, the plurality of semiconductor pressure sensing units are arranged on the substrate and are arranged in the same layer with the active layer of the thin film transistor, and further the semiconductor pressure sensing units are at least partially located at the display region of the substrate and are connected together through the plurality of connection wires formed on the substrate to form at least one Wheatstone bridge structure, so that the semiconductor pressure sensing units and the connection wires are integrated with the substrate, thereby solving the defect in the related art that the structure is complicated when the touch pressure sensor is integrated, and being adapted for mass production.

Although some embodiments and the applied technology principles of the present disclosure have been described as above, it should be understood by those skilled in the art that the present disclosure is not limited to particular embodiments described herein. Various modifications, readjustment and alternations can be made by those skilled in the art without departing the scope of protection of the present disclosure. Although the present disclosure is described in detail through the above embodiments, the present disclosure is not only limited to the above embodiments, the present disclosure can include other equivalent embodiments without departing the concept of the present disclosure, and the scope of the present disclosure is determined by appending claims.

The invention claimed is:

1. An array substrate, comprising:
   a substrate;
   a plurality of scan lines formed on the substrate, the plurality of scan lines extending along a first direction,
   a plurality of data lines formed on the substrate, the plurality of data lines extending along a second direction; and wherein
   a plurality of pixel units are defined by the scan lines and data lines, wherein in each of the plurality of the pixel units, a thin film transistor is provided, the thin film transistor comprising a gate electrode layer, an active layer and a source/drain electrode layer;
   at least four semiconductor pressure sensing units formed on the substrate, wherein the semiconductor pressure sensing units and the active layers of the thin transistors are arranged in a same plane, and the semiconductor pressure sensing units are at least partially located in a display region of the array substrate; and
   the substrate is further configured with a plurality of connection wires thereon, for connecting the semiconductor pressure sensing units to form at least one Wheatstone bridge structure,
   wherein each of the semiconductor pressure sensing unit has a strip-shaped structure extending along the first direction, and a length of each semiconductor pressure sensing unit along the first direction is larger than a length of one pixel unit along the first direction; or
   each of the semiconductor pressure sensing units has a strip-shaped structure extending along the second direction, and a length of each semiconductor pressure sensing unit along the second direction is larger than a length of one pixel unit along the second direction.

2. The array substrate of claim 1, wherein
   each of the at least one Wheatstone bridge structure comprises a first semiconductor pressure sensing unit, a second semiconductor pressure sensing unit, a third semiconductor pressure sensing unit and a fourth semiconductor pressure sensing unit, and the plurality of connection wires comprise a plurality of first connection wires, a plurality of second connection wires, a plurality of third connection wires and a plurality of fourth connection wires;
   a signal input terminal of the first semiconductor pressure sensing unit and a signal input terminal of the third semiconductor pressure sensing unit are electrically connected with the first connection wire and are electrically connected with a first detection input terminal through the first connection wire;
   a signal input terminal of the second semiconductor pressure sensing unit and a signal input terminal of the fourth semiconductor pressure sensing unit are electrically connected with the second connection wire and are electrically connected with a second detection input terminal through the second connection wire;
   a signal output terminal of the first semiconductor pressure sensing unit and a signal output terminal of the second semiconductor pressure sensing unit are electrically connected with the third connection wire and are electrically connected with a first detection output terminal through the third connection wire; and
   a signal output terminal of the third semiconductor pressure sensing unit and a signal output terminal of the fourth semiconductor pressure sensing unit are electrically connected with the fourth connection wire and are electrically connected with a second detection output terminal through the fourth connection wire.

3. The array substrate of claim 2, wherein
   each of the connection wires comprises a lead portion and a bridging portion, wherein the lead portion is electrically with the semiconductor pressure sensing unit, and the bridging portion is configured to form the Wheatstone bridge structure.

4. The array substrate of claim 3, wherein
   the lead portion and the scan lines are arranged in a same layer and extend along the same direction, the bridging portion and the scan lines are arranged in a same layer or in different layers.

5. The array substrate of claim 4, wherein
   a first insulation layer is disposed between a layer where the scan lines are arranged and a layer where the semiconductor pressure sensing units are arranged, and the first insulation layer is configured with a plurality of first through holes through which the semiconductor pressure sensing units are electrically connected with the corresponding lead portions.

6. The array substrate of claim 3, further comprising:
   a plurality of touch electrode blocks formed on the substrate, wherein the plurality of touch electrode blocks are electrically connected with respective touch leads.

7. The array substrate of claim 6, wherein
the touch leads extend in the second direction, the lead portion and the touch leads are arranged in a same layer and extend in a same direction, and the bridging portion and the touch leads are arranged in a same layer or in different layers.

8. The array substrate of claim 7, wherein
a second insulation layer is disposed between a layer where the touch leads are arranged and a layer where the semiconductor pressure sensing units are arranged, the second insulation layer is configured with a plurality of second through holes through which the semiconductor pressure sensing units are electrically connected with the corresponding lead portions.

9. The array substrate of claim 3, further comprising a non-display region surrounding the display region, wherein the semiconductor pressure sensing units and the lead portion of the connection wire are arranged in the display region, and the bridging portion of the connection wire is arranged in the display region or in the non-display region.

10. The array substrate of claim 2, wherein
a first light shielding layer is disposed between the semiconductor pressure sensing units and the substrate, a second light shielding layer is disposed between the active layer and the substrate, and the first light shielding layer and the second light shielding layer are arranged in a same layer.

11. The array substrate of claim 2, further comprising a driving chip, wherein
the driving chip is electrically connected with the first connection wire, the second connection wire, the third connection wire and the fourth connection wire.

12. The array substrate of claim 1, wherein
projections of the semiconductor pressure sensing units on the substrate are located at a light shielding region of a black matrix between the pixel units.

13. The array substrate of claim 1, wherein
projections of the semiconductor pressure sensing units on the substrate are located at a region of domain lines of the pixel unit.

14. A display panel, comprising the array substrate of claim 1 and an opposition substrate opposite to the array substrate.

* * * * *